United States Patent [19]

Tanaka et al.

[11] Patent Number: 4,996,572
[45] Date of Patent: Feb. 26, 1991

[54] SEMICONDUCTOR MEMORY DEVICE

[75] Inventors: Shinichi Tanaka, Tokyo; Masayuki Hori, Yokohama; Noriyoshi Tozawa, Kawasaki, all of Japan

[73] Assignee: Kabushiki Kaisha Toshiba, Kawasaki, Japan

[21] Appl. No.: 449,333

[22] Filed: Dec. 11, 1989

Related U.S. Application Data

[63] Continuation of Ser. No. 166,564, Mar. 10, 1988, abandoned.

[30] Foreign Application Priority Data

Mar. 13, 1987 [JP] Japan .................. 62-58110

[51] Int. Cl.$^5$ ............... H01L 29/78; H01L 29/34; H01L 29/04
[52] U.S. Cl. .................. 357/23.5; 357/54; 357/59
[58] Field of Search ................. 357/23.5, 54, 59

[56] References Cited

U.S. PATENT DOCUMENTS 4,437,172  3/1984  Masuoka ........................ 365/182
4,437,174  3/1984  Masuoka ........................ 365/218
4,466,081  8/1984  Masuoka ........................ 365/218

FOREIGN PATENT DOCUMENTS 0144900   6/1985  European Pat. Off. .
60-250676 12/1985  Japan .
61-120472  6/1986  Japan .
0187278    7/1986  Japan ........................... 357/23.5

OTHER PUBLICATIONS

Masuoka et al., A Flash E$^2$ Prom Cell Using Triple Polysilicon Technology, Proceedings of the IEEE International Electron Devices Meeting, Dec. 9–12, 1984.

Primary Examiner—Mark Prenty
Attorney, Agent, or Firm—Finnegan, Henderson, Farabow, Garrett and Dunner

[57] ABSTRACT

A semiconductor memory device containing a number of memory cells each having a floating gate, an erase gate, and a control gate. In a data erasure mode, electrons are discharged from the floating gate into the erase gate electrode. An insulating film interlaid between the erase gate and the control gate has a three-layered structure consisting of a silicon oxide film, a silicon nitride film, and a silicon oxide film.

4 Claims, 4 Drawing Sheets

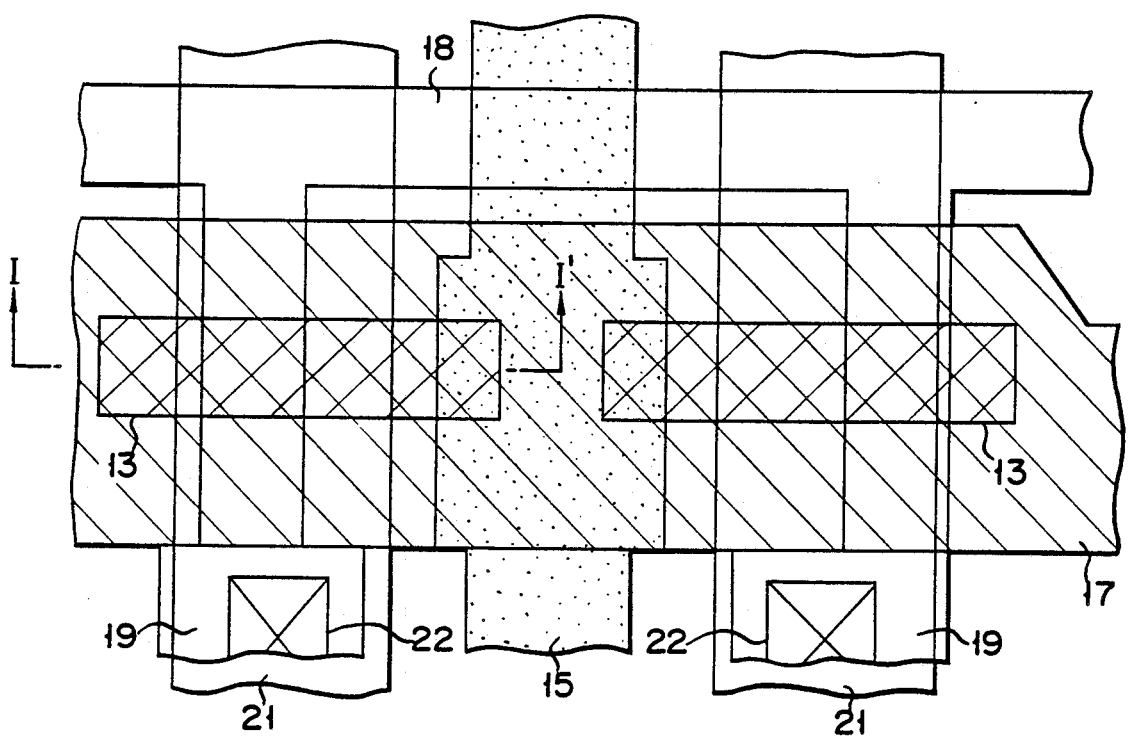
F I G. 3
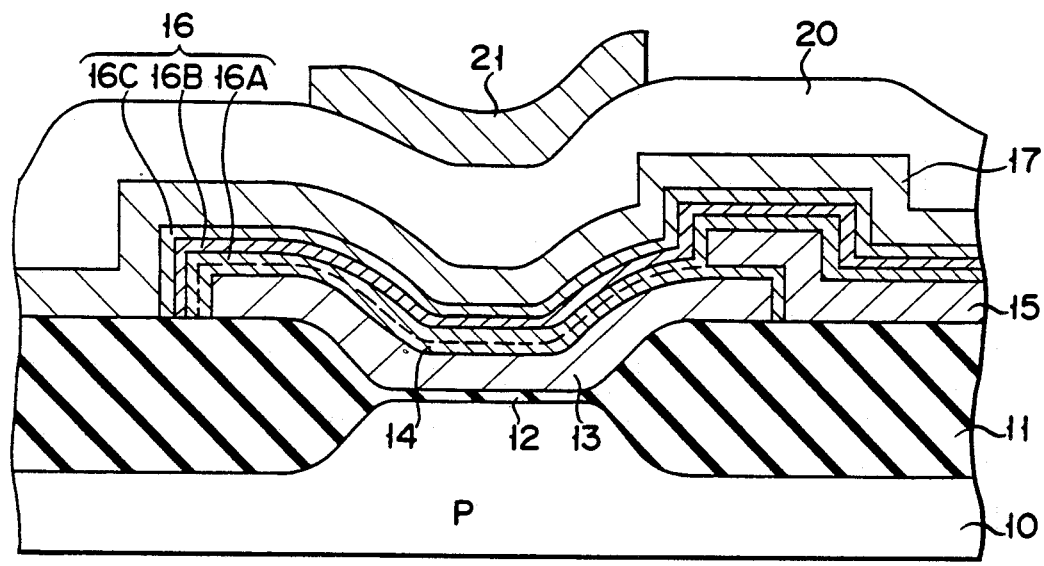
F I G. 4

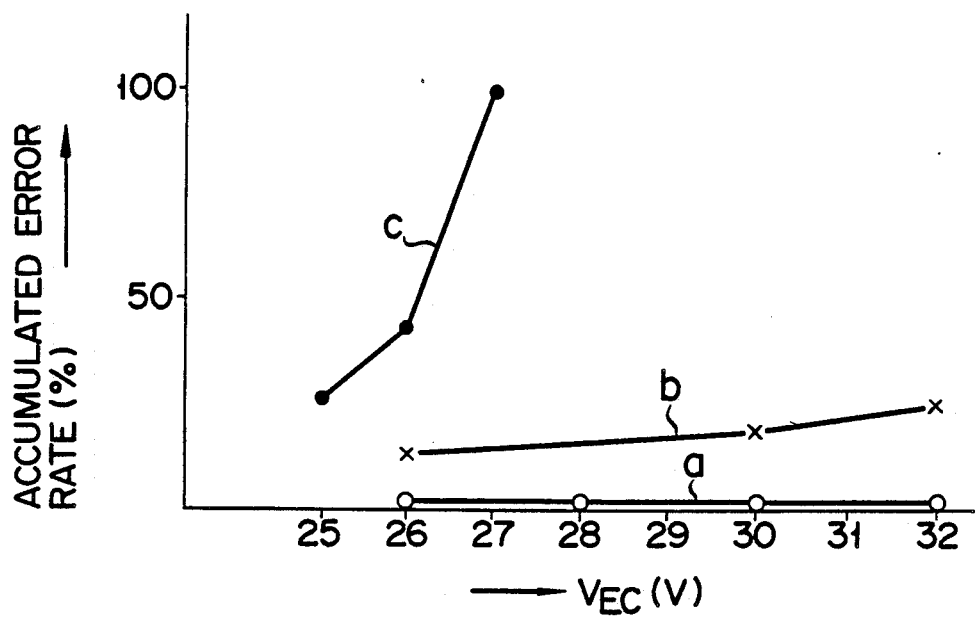
F I G. 5
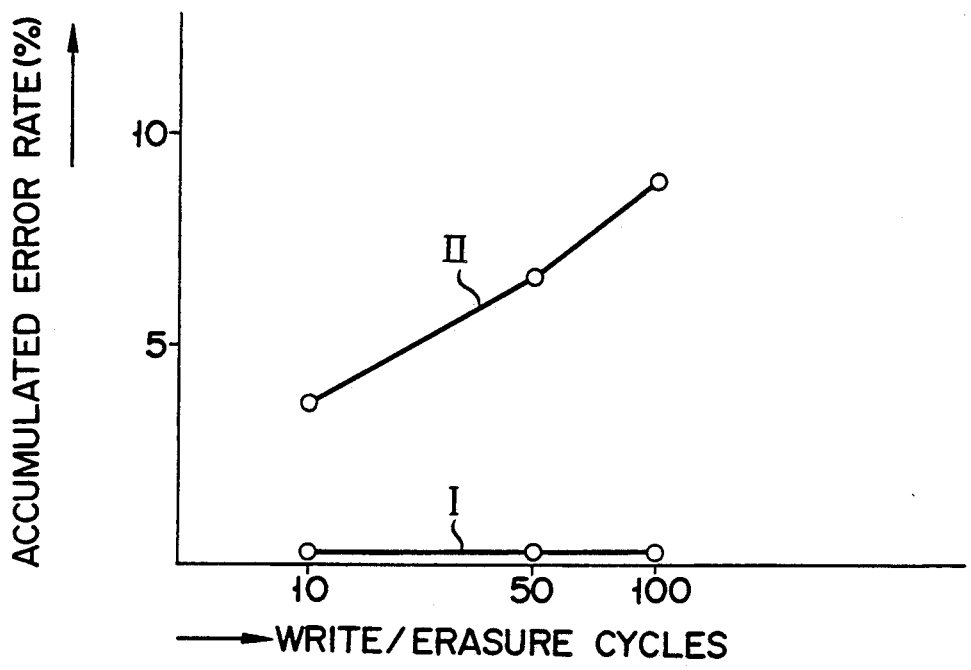
F I G. 6

SEMICONDUCTOR MEMORY DEVICE

This application is a continuation of application Ser. No. 166,564, filed 03/10/88 and now abandoned.

BACKGROUND OF THE INVENTION

1. Field of the Invention

This invention relates to a semiconductor memory device into which data can be electrically written and in which data can be electrically erased. In particularly, this invention relates to a semiconductor memory device wherein the data stored in all memory cells can be erased simultaneously.

2. Description of the Related Art

A flash type electrical erasable programmable read only memory (FE$^2$PROM) with a function to electrically erase all of the stored bits in a simultaneous manner is known as disclosed in U.S. Pat. Nos. 4,437,172 and 4,466,081. The FE$^2$PROM as disclosed in these patents allows the stored data to be electrically and simultaneously erased on all of the bit lines. With this advantageous feature, the FE$^2$PROM has progressively superseded the UV type EPROM in which the data stored therein is erased by ultraviolet rays.

An example of one of the memory cells constituting the FE$^2$PROM is illustrated in cross sectional form in FIG. 1.

In FIG. 1, showing the structure of the conventional memory cell, reference numeral 30 designates a p-type semiconductor substrate. Field oxide film 31 is layered on substrate 30, and erase gate 32, acting as a first polysilicon layer, is partially layered on field oxidation film 31. Reference numeral 33 indicates a gate oxide film. Floating gate 34 is layered on gate oxide film 33, and consists of a second polysilicon layer. The end portion of floating gate 34 is overlaid on the end portion of erase gate 32, with silicon oxide film 35 interlayered between them. Silicon oxide film 35 serves as an insulating film and is formed by oxidizing erase gate 32. Control gate 37, which serves as a third polysilicon layer, is layered over floating gate 34, with silicon oxide film 36 interlayered between them. Silicon oxide film 36 serves as an insulating film and is formed by oxidizing floating gate 34. Although not shown, source and drain regions as N type diffusion layers are provided on substrate 30, and located at sides of floating gate 34, respectively. An interlayer insulating film (not shown) is layered on control gate 37, and has contact holes opened to the source and drain regions, and the surfaces of erase gate 32 and control gate 37. Within each contact hole is formed a lead electrode made of aluminum.

The data write operation of the FE$^2$PROM with the memory cells thus structured is similar to that of the conventional EPROM. Specifically, a high voltage is applied to the drain region (not shown) of the memory cell, and control gate 37. The applied high voltage causes hot electrons in the channel region located under floating gate 34. The generated hot electrons are injected into the floating gate 34 and set at a predetermined potential, due the high voltage applied to control gate 37. The injection of electrons into floating gate 34 increases the threshold voltage in the channel region.

In an erasure mode, for erasing the data, a high voltage is applied to erase gate 32, to place the silicon oxide film 35 between erase gate 32 and floating gate 34 in a high electric field. Under this condition, the electrons which have been already injected into floating gate 34, are discharged into erase gate 32. As the result of this discharge, the threshold voltage in the channel region decreases, and the data is erased.

In a read mode for reading out the data, a fixed voltage is applied to the drain region and control gate 37. Under this condition, the memory cells into which data has been written and whose channel regions have an increased threshold voltage, are in an off state. Those memory cells whose data has been erased and whose channel regions have a decreased threshold voltage, are in an on state. The on- and off-states are read out in the form of logical "1" and "0" of the data, respectively.

In the memory cell as mentioned above, for the data erasure, electrons are discharged through silicon oxide film 35 to erase gate 32, from floating gate 34. Therefore, the erasure characteristic of this cell depends on the quality and thickness of silicon oxide film 35, and the shapes of floating gate 34 and erase gate 32, which are separated by silicon oxide film 35. To quicken the erasure operation, for example, the thickness of silicon oxide film 35 is thin, an insulation of silicon oxide film 35 is reduced by appropriately selecting a way of process for erase gate 32 and a method of forming silicon oxide film 35. However, it is very difficult to appropriately select the process and formation. If the selection is inappropriate, the data write and erasure may be performed erroneously or, more adversely, silicon oxide film 35 may be electrically broken down. Thus, great care must be used for such selection.

In FE$^2$PROM, the cause for the erroneous data write has been known and will be described. In the write mode, a high voltage is applied to control gate 37 and the drain. The same substrate further contains other memory cells which are not in the write mode, but whose control gates 37 are applied with the same high voltage. In those other memory cells, the potential at floating gate 34 is pulled to a high potential level, so that an electric field is developed between floating gate 34 and erase gate 32. It has been known that an irregularity, called asperity, is inevitably formed on the upper surface of a polysilicon layer. The leak current flowing from the first polysilicon layer having a surface of small asperity to the second polysilicon layer having a surface of great asperity is larger than the leak current flowing from the second polysilicon layer to the first polysilicon layer. In other words, more electrons move from the second to the first polysilicon layer than the first to the second polysilicon layer. In the case of the FIG. 1 memory cell, the asperity on the upper surface of erase gate 32 is larger than that on the lower surface of floating gate 34. Therefore, electrons may be injected into floating gate 34, through silicon oxide film 35 existing between erase gate 32 and floating gate 34. In this way, the erroneous data write is caused by injecting electrons into the floating gates of those memory cells which are not in the write mode.

An ideal characteristic required for the insulating films used in the memory cells in FE$^2$PROM is that the leak current easily flows ir the erasure direction, but hardly flows in the opposite direction, i.e., the write direction. In this respect, the electrical characteristic of the conventional memory cell shown in FIG. 1 is not always satisfactory.

To cope with this, the memory cell as shown in sectional form in FIG. 2 has been proposed. In this memory cell, the first polysilicon layer constitutes floating gate 34. A second polysilicon layer forms an erase gate 32. Insulating film 38 existing between erase gate 32 and control gate 37 is formed by oxidizing the polysilicon of erase gate 32.

In the FIG. 2 prior art, one end portion of erase gate 32 is laid on the end portion of floating gate 34. Therefore, a relative large asperity is formed on the upper surface of floating gate 34. At this time, more electrons move from the lower surface of erase gate 32, having a surface of small asperity, to the upper surface of floating gate 34, having a surface of great asperity, than from the upper surface of floating gate 34 to the lower surface of erase gate 32. Therefore, in the memory cell of FIG. 2, the erroneous write operation is restricted and the erasure characteristic is improved.

In this FIG. 2 memory cell, like the FIG. 1 memory cell, a silicon oxide film formed by oxidizing polysilicon is used for the silicon oxide film 38 interlaid between erase gate 32 and control gate 37.

In the data erasure move, a high electrical field is continuously applied to between erase gate 32 and control gate 37. When the write mode/erasure cycle is progressively repeated, the insulating film existing between erase gate 32 and control gate 37 will finally fatigue, and adversely break down.

SUMMARY OF THE INVENTION

Accordingly, an object of this invention is to provide a semiconductor memory device which can suppress the erroneous write operation and improve erasure improve and having an insulating film which is difficult to fatigue and break down when it is subjected to the repeated write/erasure cycles.

According to this invention, there is provided a semiconductor memory device comprising: a semiconductor substrate of a first conductivity type; a floating gate layered on a first insulating film which is also layered on the substrate; an erase gate partially overlapping with the floating gate with a second insulating film interlaid therebetween; and a control gate layered above the floating gate and the erase gate with a third insulating film of a three layered structure consisting of a first oxide film, a nitride film, and a second oxide film, the third insulating film being interlaid therebetween.

The three-layered film, consisting of an oxide film, a nitride film and an oxide film, is interlaid between the erase gate and the control gate. As a result, a breakdown performance of the insulating film between these gates is increased, and a guaranteed number of write/erasure cycles is increased.

BRIEF DESCRIPTION OF THE DRAWINGS

Other objects and advantages of this invention will become apparent from the following description when taken in connection with the drawings in which:

FIG. 3 is a plan view of a group of memory cells used in a semiconductor memory device according to this invention;

FIG. 4 is a sectional view taken on line I—I' in FIG. 3;

FIG. 5 is a graph comparatively showing variations of an accumulated error rate vs. voltage applied to the memory cells of semiconductor memory devices of the prior art and of this invention;

FIG. 6 is a graph comparatively showing variations of an accumulated error rate vs. write/erasure cycles of memory cells of the semiconductor memory devices of the prior art and of this invention;

DETAILED DESCRIPTION OF THE PREFERRED EMBODIMENTS

Figure 1:
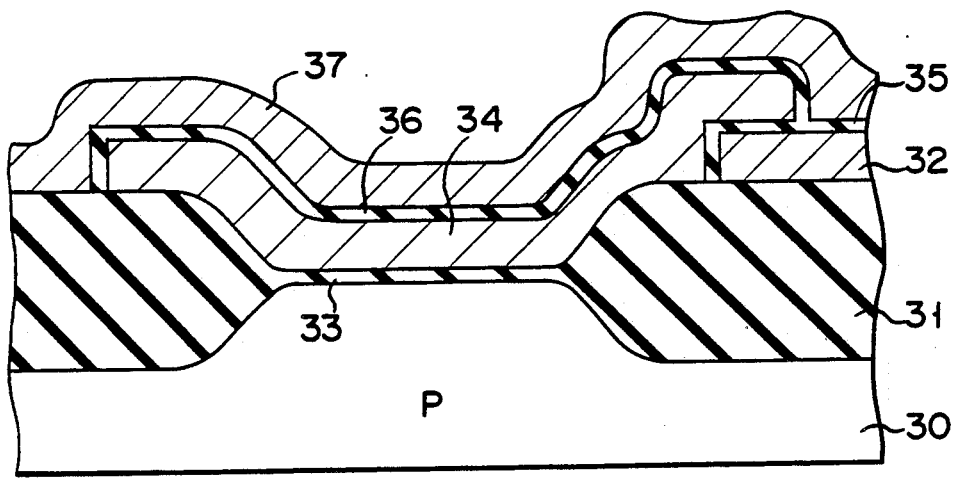
FIG. 1 is a sectional view of a memory cell used in a conventional memory device.
Figure 2:
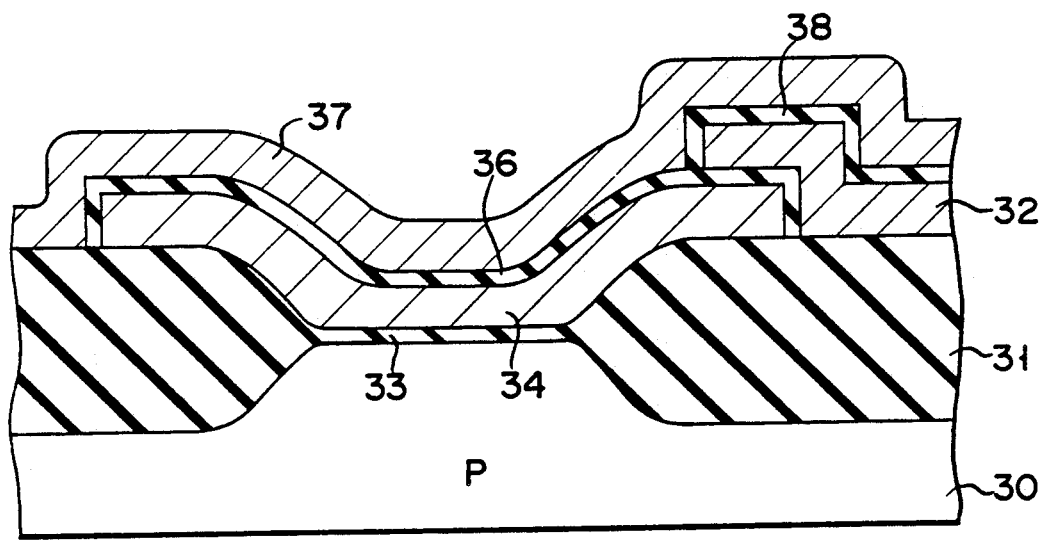
FIG. 2 is a sectional view of another memory cell used in a conventional memory device.

A preferred embodiment of a semiconductor memory device according to this invention will be described referring to FIGS. 3 and 4. A group of memory cells used for a semiconductor memory device according to this invention is shown in FIG. 3. A cross section of the memory cell taken on line I—I' is shown in FIG. 4. In the figure, reference numeral 10 designates a silicon semiconductor substrate of p-type. Field oxide film 11 for separating the adjacent memory cells from one another is formed on substrate 10. Gate oxide film 12 is formed on a specific location of substrate 10 which corresponds to a channel region in the element region as separated by field oxide film 11. Floating gate 13 as a first polysilicon layer is formed on gate oxide film 12. Both ends of floating gate 13 extend over field oxide film 11.

Erase gate 15 as a second polysilicon layer is laid above one end of floating gate 13 with silicon oxide film 14 interlaid therebetween. Silicon oxide film 14 serves as an insulating film and is formed by oxidizing the polysilicon layer of floating gate 13. Erase gate 15 overlaps with the end portions of floating gate 13 of two adjacent memory cells as viewed horizontally in FIG. 3. Three-layered 16 film is layered over floating gate 13 and erase gate 15. Control gate 17 consisting of a third polysilicon layer is continuously layered over the three layered film 16. Three-layered film 16 consists of first silicon oxide ($SiO_2$) film 16A as a bottom layer, second silicon nitride ($Si_3N_4$) film 16B as a medium layer, and a third silicon oxide ($SiO_2$) film 16C as a top layer. Source region 18 and drain region 19 as n-type diffusion layers are formed on the element region surfaces located at both sides of floating gate 13, respectively. Source region 18 is a single layer and used in common for all of the memory cells. Interlaying insulating film 20 is laid on control gate 17. Conductive layer 21 made of aluminum, for example, is formed on interlaying insulating film 20.

The following description is for a method of manufacturing the memory cells functioning as described above. To begin with, field oxide film 11 is formed on substrate 10. The first polysilicon layer is deposited thereon. An appropriate impurity such as phosphorus or arsenic are diffused into the polysilicon layer. The first polysilicon layer is patterned by a reactive ion etching process (RIE), to form floating gate 13. The structure is thermally oxidized in a condition that it is placed at 1000° C. and for 30 minutes in gas containing $O_2$ and $N_2$ with the proportion of 2 to 8. As the result of this thermal oxidization, silicon oxide film 14, 350 Angstroms thick, is formed on the surface of floating gate 13. A second polysilicon layer is deposited over the surface of the structure. Phosphorus or arsenic impurity is diffused into the second polysilicon layer. Then, the second polysilicon layer is patterned by a chemical dry etching (CDE) process, to form erase gate 15. The structure is thermally oxidized in a condition that it is placed at 1000° C. and for 30 minutes in gas containing $O_2$ and $N_2$ with the proportion of 5 to 5. As the result of this thermal oxidization, silicon oxide film 16A, 400 Angstroms thick, is formed over floating gate 13 and erase gate 15. Silicon nitride film 16B of 150 Angstroms in thickness is then formed over silicon oxide film 16A by a chemical vapor deposition (CVD) process at 700° C. and for 20 minutes. The structure is placed in a wet atmosphere and thermally oxidized at 1000° C. for 50 minutes, to form silicon oxide film 16C of 50 Angstroms in thickness on the surface of silicon nitride film 16B. A third polysilicon layer is deposited and doped with phosphorus or arsenic impurity at $6 \times 10^{20}/cm^3$ or more, and then is patterned, to form control gate 17.

After interlaying insulating film 20 is layered over the entire surface of the structure, contact holes 22 opened to the surface of drain region 19 of memory cells are formed in this interlaying insulating film 20. Then, aluminum is uniformly deposited on the entire surface of the structure by a vacuum deposition process. The deposited aluminum is patterned to form interconnection layer 21.

In the memory cells thus arranged, floating gate 13 partially overlaps with erase gate 15, while the former is laid under the latter. Therefore, a relatively great amount of asperity appears on the upper surface of floating gate 13. With this feature, the leak current in the direction to cause erroneous write is restricted, and the leak current in the direction to cause data erasure is improved.

Further in this embodiment, the insulating film interlaid between erase gate 15 and control gate 17 is the three-layered film 16 consisting of silicon oxide film 16A, silicon nitride film 16B and silicon oxide film 16. The use of the insulating film with such a structure remarkably increases the breakdown performance between erase gate 15 and control gate 17, when it is compared with that of the prior art.

Silicon oxide film 16A as a first layer of three-layered film 16, is formed by oxidizing floating gate 13 and erase gate 15. Silicon nitride film 16 as a second layer, is formed by a CVD process. Silicon oxide film 16C, as a third layer, is formed by oxidizing silicon nitride film 16B.

In the current $FE^2PROM$ cells, about 28 V is applied between the erase gate and the control gate when the memory device is in the data erasure mode. Three-layered film 16 is assumed to be designed such that silicon oxide film 16A is 400 Angstroms, silicon nitride film 16B is 150 Angstroms, and silicon oxide film 16C is 50 Angstroms. The voltage applied between the erase gate 15 and the control gate 17 is 5.3 MV/cm. In this case, the thickness of silicon nitride film 16B is approximately 75 Angstroms in terms of the silicon oxide film thickness. This figure of electric field is satisfactory in practical use. If the thickness of silicon oxide film 16A as the first layer is 600 Angstroms, the electric field is 3.9 MV/cm further improving the breakdown performance.

Turning now to FIG. 5, there is shown a graph illustrating a variation of accumulated error rate with respect to the voltage $V_{EC}$ applied between the erase gate and the control gate. In the graph, two types of variations are plotted, one for the memory cell according to this embodiment, and the other for the memory cell of the prior art. As shown, the abscissa represents the voltage $V_{EC}(V)$, while the ordinate represents accumulated error rate (%). Curves "a" and "b" are the variations of error rate of the memory cells according to this embodiment. More specifically, curve "a" represents a variation of error rate when the thickness of the silicon oxide film 16A as the first layer is 600 Angstroms. Curve "b" represents a variation of error rate when it is 400 Angstroms. Common for both curves "a" and "b", the thickness of silicon nitride film 16B as the second layer is 150 Angstroms and that of silicon oxide film 16C as the third layer is 50 Angstroms. Curve "c" indicates a variation of error rate of the prior art memory cell. In this case, the insulating film between the erase gate and the control gate is a silicon oxide film of 1200 Angstrom thick.

As seen from FIG. 5, curve "b" shows that error rate is about 20% in the vicinity of 30 V of $V_{EC}$. In curve "c", it is about 0% at 32 V. Contradistinctively, in curve "c", error rate is 100% when voltage $V_{EC}$ reaches 27 V. This indicates that at this voltage, all of the memory cells are perfectly broken down.

In the memory cell of the type in which the breakdown voltage of three-layered insulating film 16 is guaranteed up to 30 V, if it is repeatedly subjected to the write/erasure cycles, the film 16 will be broken down at a certain percentage. This phenomenon is known as time depend dioxide breakdown (TDDB) in this field. TDDB occurs due to the fact that some defects possibly existing in this film are fatigued by the weak current repeatedly flowing therethrough. In this respect, the highest possible guaranteed breakdown voltage is required for desirable memory devices, in practical use.

FIG. 6 shows a variation of accumulated error rate against a number of write/erasure cycles when the memory cell according to this embodiment is used. In the figure, the abscissa represents write/erasure cycles (number of cycles) and the ordinate represents accumalated error rate (%). Curve I is plotted for the silicon oxide film 16A of 600 Angstroms of three-layered film 16. Curve II is plotted for the film 16A of 400 Angstroms of three-layered film 16. In this case, silicon nitride film 16B and silicon oxide film 16C are 150 and 50 Angstroms, respectively, for both the curves. As seen, at 100 cycles of data write and erasure, the error rate is about 8% for the 400 Angstroms silicon oxide film 16A, and the error rate is about 0% for the 600 Angstroms silicon oxide film. As a matter of course, as the number of cycles is reduced the error rate is reduced.

As seen from FIGS. 5 and 6, the accumulated error rate may further be improved by merely increasing the thickness of the silicon oxide film 16A as the first layer of three-layered film 16. There is a limit in increasing the thickness of this film, however. The reason for this follows. When silicon oxide film 16A is formed, floating gate 13 is simultaneously oxidized, so that the insulating film between control gate 17 and floating gate 13 becomes excessively thick. The excessively thick film hinders the application of potential to substrate 10 when a high voltage is applied to control gate 17 in the data write mode. This deteriorates the write characteristic of the memory device. Increase of the drain voltage in the write mode may solve this problem to a certain degree, and is not a perfect solution. Therefore, it appears that the thickness of silicon oxide film 16A of the three-layered film 16 depends on the capability of the memory device.

The breakdown performance of the insulating film between erase gate 15 and control gate 17 of the memory cell is improved by inserting the three-layered film 16 between them, as already mentioned. The following two reasons for this may be considered.

A first reason for this is that the three-layered film has a lower density of weak spots contained in the insulating film than the single insulating film. A second reason resides in the current mechanism peculiar to the three-layered film. A number of carriers generated when the leak current is caused are electrons in silicon oxide film 16A or 16C of the three-layered film, and these are holes in silicon nitride film 16B. The leak current is caused in silicon nitride film 16B either when hole current is easy to flow due to the weak spots or when electron current is easy to flow in silicon nitride film. Since there is a rare case that both currents flow simultaneously, the breakdown performance between the erase gate and the control gate in the memory cell can be improved.

As described above, the breakdown performance between the erase gate and the control gate in the memory cell can be improved, and the guaranteed number of write/erasure cycles may be remarkably improved. Provision of the three-layered insulating film between the erase gate and the control gate restricts generation of the leak current between these gates. This implies that the electrons injected into floating gate 13 are kept therein for a long time. With this, the test yield and the reliability of the memory device as well are improved.

Erase gate 15 and control gate 17 are formed for a number of memory cells, and are used as interconnection layers, respectively. For resistance reduction purposes, the polysilicon layer of erase gate 15 and control gate 17 are doped with an impurity, such as phosphorous or arsenic at $6 \times 10^{20}/cm^3$ or more, i.e., a figure near solution limit. With this, generally, the polysilicon layer of floating gate 13 is also doped with phosphorus or arsenic at a concentration approximate to the above. The polysilicon layer as the first layer is doped with the impurity at a concentration of less than $6 \times 10^{20}/cm^3$, for example, $1 \times 10^{20}/cm^3$ to $4 \times 10^{20}/cm^3$. These figures are much smaller than that of gates 15 and 17.

When the polysilicon layer sufficiently contains impurity atoms near the solution limit, the asperity on its surface is remarkably reduced when it is subjected to a subsequent oxidizaticn. In other words, it has a smoothed surface. When its impurity concentration is less than $6 \times 10^{20}/cm^3$, the subsequent oxidization causes a great asperity on the surface of the polysilicon layer. The cause for this is considered that the oxidizing rate is not uniform over the surface of polysilicon layer.

Therefore, a great asperity appears on the surface of floating gate 13 with the lower impurity concentration. And the electric field concentration occurs on the surface. This concentrated electric field makes it easy to generate the leak current. In other words, in this type of memory cell, the leak current flowing from the erase gate toward the floating gate increases. This fact implies that electrons are flow easily from floating gate 13 toward erase gate 15, improving the erasure characteristic. The leak current in the reverse direction does not increase, to impede the flow of electrons from erase gate 15 toward floating gate 13, and to minimize the erroneous data write.

Figure 7:
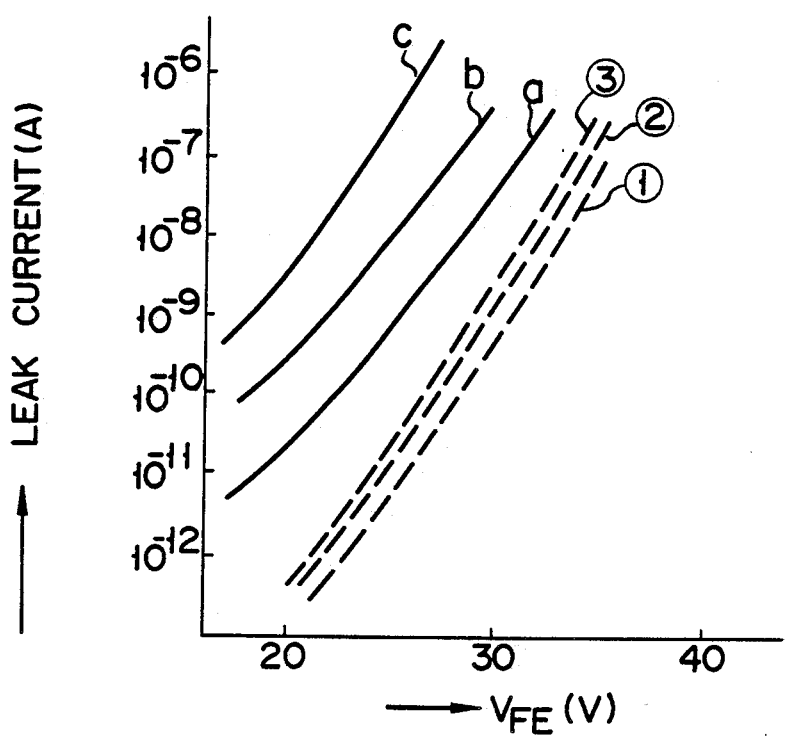
FIG. 7 is a graph showing a variation of the leak current vs. voltage applied to the memory cells of the semiconductor memory device according to this invention.

A graph of FIG. 7 comparatively shows leak current characteristics between the floating gate and the erase gate of the conventional memory cell and the memory cell of this embodiment. In the graph, the abscissa represents a voltage $V_{FE}(V)$ between the floating gate and the erase gate, and the ordinate represents a leak current (A).

Curves "a", "b" and "c" indicate variations of the leak current when a voltage $V_{FE}$ is applied to those gates, with its positive polarity at the erase gate. These curves "a", "b" and "c" are for the impurity (phosphorus) concentrations of the region 13, $6 \times 10^{20}/cm^3$, $4 \times 10^{20}/cm^3$, and $2 \times 10^{20}/cm^3$, respectively. Further, curve "a" is the leak current variation of the conventional memory cell. Curves "b" and "c" show the leak current variation of the memory cells according to this embodiment. Curves and ①, ② and ③ indicate variations of the leak current when a voltage $V_{FE}$ is applied to those gates, with its positive polarity at the floating gate. These curves "a", "b" and "c" are for the impurity (phosphorus) concentrations of the floating gate 13, $6 \times 10^{20}/cm^3$, $4 \times 10^{20}/cm^3$, and $2 \times 10^{20}/cm^3$, respectively. Further, curve ① is the leak current variation of the conventional memory cell. Curves ② and ③ show the leak current variation of the memory cells according to this embodiment.

As seen from the graph, as the impurity concentration of the floating gate 13 decreases, electrons flowing from the floating gate to the erase gate becomes large. The leak current in this direction contributes to the discharge of electrons from the floating gate to the erase gate. As a result, the erasure characteristic can be improved by reducing the impurity concentration in the floating gate 13. The leak current flowing from the floating gate to the erase gate increases a little. This directional leak current contributes to the erroneous write operation in which electrons are injected into the floating gate. Thus, the increase of the leak current is small, and hence the occurrence of the erroneous write operation is limited. It is confirmed that in actual FE²-PROM memory cells, as the impurity concentration of the floating gate decreases, a rate of erroneous write occurrences decreases. This is because since the erasure characteristic of each cell is improved due to the low impurity concentration of the floating gate, neutralize. If less electrons than the holes are injected into floating gate, the gate remains positively charged.

Figure 8:
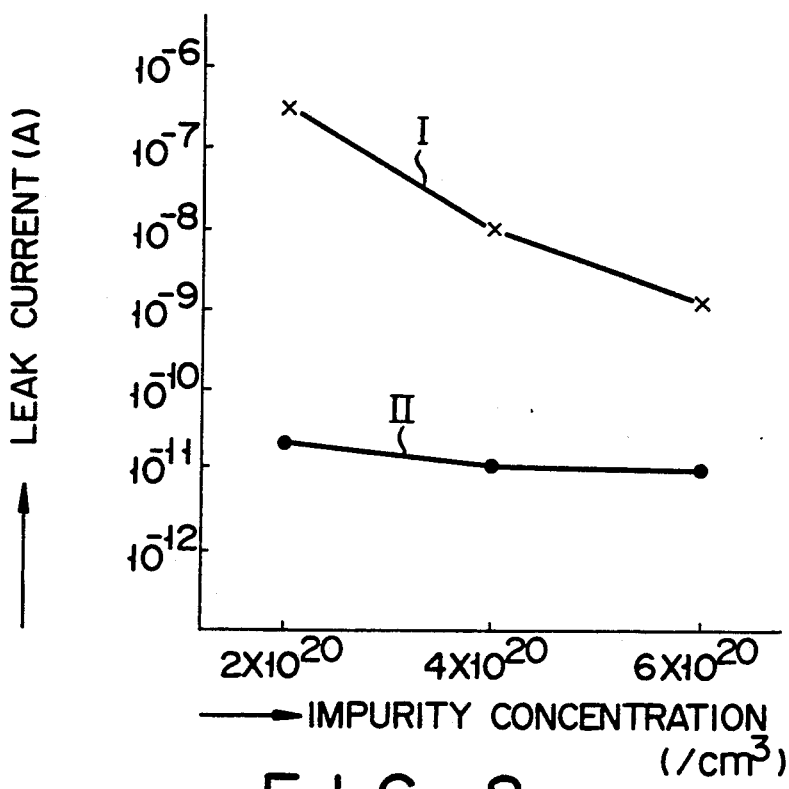
FIG. 8 is a graph showing a variation of the leak current vs. impurity concentration of memory cells in the semiconductor memory device according to this invention.

FIG. 8 shows characteristic curves, which describe variations of the leak current between the floating gate and the erase gate. The abscissa of the graph represents a concentration ($/cm^3$) of impurity (phosphorus) in the floating gate 13. The ordinate represents a leak current (A). In the graph, characteristic curve I indicates a variation of a leak current flowing from erase gate 15 to floating gate 13, when a voltage of 25 V is applied between erase gate 15 and floating gate 13. In this case, erase gate 15 is set at the positive polarity of the applied voltage. This curve shows that the leak current increases with reduction of the impurity concentration of the floating gate 13. The increased leak current provides an improved erasure characteristic.

Characteristic curve II indicates a variation of a leak current flowing from floating gate 13 to erase gate 15, when a voltage of 25 V is applied between floating gate 13 and erase gate 15. In this case, floating gate 13 is set at the positive polarity of the applied voltage. This curve II shows that the leak current increases slightly when the impurity concentration in the floating gate 13 is decreased.

These curves also show that in the vicinity of $6 \times 10^{20}/cm^3$ of impurity concentration, a difference between the leak currents flowing from floating gate 13 to erase gate 15 and from erase gate 15 to floating gate 13 is small. It is known that when the current difference is below a value of 2 digits or less, the erasure characteristic and production yield are deteriorated. Therefore, if the impurity concentration is set in the range from $4\times 10^{20}/cm^3$ to $2\times 10^{20}/cm^3$, the current difference is satisfactorily large, and the memory device is free from the problem of the erasure characteristic and production yield.

Since the erasure characteristic depends on the overlapping portion of floating gate 13 and erase gate 15, the impurity concentration of this portion may be set to be lower than the solution limit.

With such an arrangement, improvement is made of the erroneous write characteristic and the erasure characteristic, and the breakdown performance of the interlaying insulating film with the three layered structure due to its fatigue by the repeated weak current flow during the repeated write/erasure cycles.

What is claimed is:

1. A semiconductor memory device comprising:
   a first conductive semiconductor substrate;
   a floating gate formed on the semiconductor substrate with a first insulating film inserted between said first conductive semiconductor substrate and said floating gate, said floating gate being made of polycrystal silicon which includes an impurity at a density of less than $6\times 10^{20}/cm^3$;
   a silicon oxide film formed on said floating gate and having a number of irregularities on its top surface;
   an erase gate formed on the first insulating film and formed on part of said silicon oxide film so as to overlap part of the floating gate, said erase gate being made of polycrystal silicon which includes an impurity at a density of at least $6\times 10^{20}/cm^3$;
   a second insulating film formed on the silicon oxide film over the floating gate and the erase gate, said second insulating film comprising a three-layered structure made of a first silicon oxide film, a silicon nitride film and a second silicon oxide film; and
   a control gate formed on the second insulating film, over the floating gate and the erase gate, said control gate being made of polycrystal silicon which includes an impurity at a density of at least $6\times 10^{20}/cm^3$.

2. A semiconductor memory device according to claim 1, wherein said first conductive semiconductor substrate comprises a silicon substrate.

3. A semiconductor memory device according to claim 1, wherein said first silicon oxide film is $\geq 400$ Angstroms in thickness, said silicon nitride film is $\geq 50$ Angstroms, and said second silicon oxide film is $\geq 50$ Angstroms.

4. A semiconductor memory device according to claim 1, wherein the impurity densities of the impurities contained in said erase gate and said control gate are approximately equal to a solution limit, and the impurity density of the impurity contained in said floating gate is less than said solution limit.

* * * * *